(12) United States Patent
Ha et al.

(10) Patent No.: US 8,728,862 B2
(45) Date of Patent: May 20, 2014

(54) THIN FILM TRANSISTOR, METHOD OF MANUFACTURING THE SAME AND FLAT PANEL DISPLAY DEVICE HAVING THE SAME

(75) Inventors: Jae-Heung Ha, Suwon-si (KR);
Young-Woo Song, Suwon-si (KR);
Jong-Hyuk Lee, Suwon-si (KR);
Jong-Han Jeong, Suwon-si (KR);
Min-Kyu Kim, Suwon-si (KR);
Yeon-Gon Mo, Suwon-si (KR);
Jae-Kyeong Jeong, Suwon-si (KR);
Hyun-Joong Chung, Suwon-si (KR);
Kwang-Suk Kim, Suwon-si (KR);
Hui-Won Yang, Suwon-si (KR);
Chaun-Gi Choi, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/462,535

(22) Filed: May 2, 2012

(65) Prior Publication Data

US 2012/0220077 A1  Aug. 30, 2012

Related U.S. Application Data

(62) Division of application No. 13/276,884, filed on Oct. 19, 2011, now Pat. No. 8,193,535, which is a division of application No. 12/393,422, filed on Feb. 26, 2009, now Pat. No. 8,178,884.

(30) Foreign Application Priority Data

Jul. 8, 2008  (KR) .................. 10-2008-0066002

(51) Int. Cl.
*H01L 21/16* (2006.01)
*H01L 21/00* (2006.01)

(52) U.S. Cl.
USPC ............. 438/104; 438/149; 438/151; 257/43; 257/104; 257/E21.37; 257/E27.014

(58) Field of Classification Search
None
See application file for complete search history.

(56) References Cited

U.S. PATENT DOCUMENTS 6,534,788 B1  3/2003  Yeo et al.
6,577,011 B1  6/2003  Buchwalter et al.
(Continued)

FOREIGN PATENT DOCUMENTS

CN  1354383  6/2002
CN  1481203  3/2004
(Continued)

OTHER PUBLICATIONS

Office Action of EP Patent Application No. 09164894.9 dated Nov. 9, 2009.

(Continued)

*Primary Examiner* — Zandra Smith
*Assistant Examiner* — Khanh Duong
(74) *Attorney, Agent, or Firm* — H.C. Park & Associates, PLC

(57) ABSTRACT

A thin film transistor, a method of manufacturing the thin film transistor, and a flat panel display device including the thin film transistor. The thin film transistor includes: a gate electrode formed on a substrate; a gate insulating film formed on the gate electrode; an activation layer formed on the gate insulating film; a passivation layer including a compound semiconductor oxide, formed on the activation layer; and source and drain electrodes that contact the activation layer.

10 Claims, 12 Drawing Sheets

(56) References Cited

U.S. PATENT DOCUMENTS

| | | | |
|---|---|---|---|
| 6,794,220 B2 | 9/2004 | Hirai et al. | |
| 6,795,226 B2 | 9/2004 | Agrawal et al. | |
| 6,850,005 B2 | 2/2005 | Yoneda et al. | |
| 6,858,479 B2 | 2/2005 | Kim et al. | |
| 6,897,087 B2 | 5/2005 | Yanagawa et al. | |
| 6,967,436 B2 | 11/2005 | Park | |
| 7,109,119 B2 | 9/2006 | Bao et al. | |
| 7,125,757 B2 | 10/2006 | Hwang et al. | |
| 7,215,075 B2 | 5/2007 | Kurata | |
| 7,223,641 B2 | 5/2007 | Maekawa | |
| 7,462,514 B2 | 12/2008 | Shiroguchi et al. | |
| 7,531,294 B2 | 5/2009 | Yamamoto et al. | |
| 7,550,914 B2 | 6/2009 | Eida et al. | |
| 7,635,889 B2 * | 12/2009 | Isa et al. | 257/309 |
| 7,638,358 B2 * | 12/2009 | Oh et al. | 438/99 |
| 7,638,360 B2 * | 12/2009 | Ryu et al. | 438/104 |
| 7,642,715 B2 | 1/2010 | Hayashi | |
| 7,645,478 B2 | 1/2010 | Thelss et al. | |
| 7,682,882 B2 * | 3/2010 | Ryu et al. | 438/149 |
| 7,722,919 B2 | 5/2010 | Yamazaki et al. | |
| 7,724,331 B2 | 5/2010 | Kim et al. | |
| 7,732,330 B2 * | 6/2010 | Fujii | 438/678 |
| 7,812,355 B2 | 10/2010 | Shiroguchi et al. | |
| 7,910,932 B2 | 3/2011 | Marks et al. | |
| 7,943,937 B2 | 5/2011 | Jung | |
| 2001/0046005 A1 | 11/2001 | Lim et al. | |
| 2002/0039166 A1 | 4/2002 | Song | |
| 2002/0050599 A1 | 5/2002 | Lee et al. | |
| 2005/0146663 A1 | 7/2005 | Kim et al. | |
| 2006/0138405 A1 * | 6/2006 | Yang et al. | 257/40 |
| 2006/0244107 A1 | 11/2006 | Sugihara et al. | |
| 2007/0031990 A1 | 2/2007 | Maekawa | |
| 2007/0057932 A1 | 3/2007 | Shin et al. | |
| 2007/0272922 A1 * | 11/2007 | Kim et al. | 257/43 |
| 2008/0012477 A1 | 1/2008 | Koo et al. | |
| 2008/0023703 A1 | 1/2008 | Hoffman et al. | |
| 2008/0149935 A1 | 6/2008 | Lee | |
| 2008/0197356 A1 | 8/2008 | Kim et al. | |
| 2008/0246025 A1 | 10/2008 | Nomura et al. | |
| 2009/0001374 A1 | 1/2009 | Inoue et al. | |
| 2009/0050876 A1 | 2/2009 | Marks et al. | |
| 2010/0243993 A1 | 9/2010 | Saito et al. | |

FOREIGN PATENT DOCUMENTS

| | | |
|---|---|---|
| JP | 2004-273614 | 9/2004 |
| JP | 2005-033172 | 2/2005 |
| JP | 2006-93400 | 4/2006 |
| JP | 2007-073559 | 3/2007 |
| JP | 2007-123861 | 5/2007 |
| JP | 2007-258675 | 10/2007 |
| JP | 2007-281486 | 10/2007 |
| KR | 10-2007-0031090 | 3/2007 |
| KR | 10-2007-0081250 | 8/2007 |
| KR | 10-0786498 | 12/2007 |
| WO | 2007/088722 | 8/2007 |
| WO | 2008/023553 | 2/2008 |
| WO | 2008/069056 | 6/2008 |

OTHER PUBLICATIONS

Non-Final Office Action of U.S. Appl. No. 12/393,422 dated Feb. 3, 2011.

Final Office Action of U.S. Appl. No. 12/393,422 dated Jun. 21, 2011.

Non-Final Office Action of U.S. Appl. No. 12/393,422 dated Sep. 13, 2011.

Notice of Allowance of U.S. Appl. No. 12/393,422 dated Feb. 15, 2012.

Notice of Allowance of U.S. Appl. No. 13/276,884 dated Mar. 6, 2012.

Office Action issued to European Patent Application No. 09164894.9 dated May 3, 2013.

\* cited by examiner

THIN FILM TRANSISTOR, METHOD OF MANUFACTURING THE SAME AND FLAT PANEL DISPLAY DEVICE HAVING THE SAME

CROSS-REFERENCE TO RELATED APPLICATION

This application is a divisional of U.S. application Ser. No. 13/276,884, filed on Oct. 19, 2011, which is a divisional of U.S. application Ser. No. 12/393,422, filed on Feb. 26, 2009, and claims the benefit of Korean Patent Application No. 10-2008-0066002, filed on Jul. 8, 2008, all of which are hereby incorporated by reference for all purpose as if fully set forth herein.

BACKGROUND

1. Field

Aspects of the present invention relate to a thin film transistor, a method of manufacturing the same, and a flat panel display device including the same.

2. Discussion of the Background

A thin film transistor generally includes: an activation layer including a channel region, a source region, and a drain region; and a gate electrode which is formed on the channel region. The gate electrode is electrically insulated from the activation layer, by a gate insulating film.

An activation layer is generally formed of semiconductor material, such as amorphous silicon or poly-silicon. However, if an activation layer is formed of amorphous silicon, it is difficult to implement a high speed driving circuit, due to it having low electron mobility. If the activation layer is formed of poly-silicon, a separate compensation circuit should be added, due to uneven threshold voltages.

A conventional method of manufacturing a thin film transistor, using a low temperature poly-silicon (LTPS), involves an expensive process such as a laser annealing. In addition, such a method is difficult to apply to larger substrates.

Research into using a compound semiconductor as an activation layer has been recently conducted, in order to solve the above problems. For example, Japanese Patent Laid-Open Publication No. 2004-273614 discloses a thin film transistor that has a zinc oxide (ZnO), or a compound semiconductor having zinc oxide (ZnO), as a main ingredient, as an activation layer.

The compound semiconductor is evaluated as a stable material, having an amorphous shape. If such a compound semiconductor is used as an activation layer, the compound semiconductor has various advantages, in that the thin film transistor may be manufactured at a temperature below 350° C., using existing processing equipment. In addition, an ion implantation process may be omitted.

However, a compound semiconductor can be damaged by plasma, when a thin film formed thereon is etched. Such damage degrades the electrical properties of the compound semiconductor, such that the threshold voltage of the thin film transistor changes.

SUMMARY

Aspects of the present invention provide a thin film transistor having improved damage resistance, during the formation and/or patterning of a passivation layer, a method of manufacturing the same, and a flat panel display device having the same.

Aspects of the present invention provide a thin film transistor that resists damage due to external light, a method of manufacturing the same, and a flat panel display device having the same.

Aspects of the present invention proved a thin film transistor, comprising: a substrate; a gate electrode formed on the substrate; a gate insulating film formed on the gate electrode; an activation layer formed on the gate insulating film, including a compound semiconductor oxide; a passivation layer formed on the activation layer; and source electrode and drain electrodes that contact the activation layer. The passivation layer is formed of an inorganic oxide.

According to another aspect of the present invention, there is provided a method of manufacturing a thin film transistor, comprising: forming a gate electrode on a substrate; forming a gate insulating film on the gate electrode; forming an activation layer including a compound semiconductor oxide, on the gate insulating film; forming a passivation layer including an inorganic oxide, on the activation layer; and forming source and drain electrodes that contact the activation layer.

According to another aspect of the present invention, there is provided a flat panel display device, comprising: opposing first and second substrates; pixel electrodes formed on the first substrate, scan and data lines formed around the pixel electrodes; thin film transistors connected to the pixel electrodes, the scan lines, and the data lines, which control signals supplied to each pixel electrode; and a liquid crystal injected into a sealed space between the first and second substrates. Each thin film transistor comprises: a gate electrode formed on the first substrate; an activation layer formed of a compound semiconductor oxide, which is insulated from the gate electrode by a gate insulating film; a passivation layer formed on the activation layer; and source electrode and drain electrode which contact the activation layer. The passivation layer is formed of an inorganic oxide.

According to another aspect of the present invention, provided is a flat panel display device, comprising: opposing first and second substrates; organic light emitting devices formed on the first substrate; scan and data lines formed around the organic light emitting devices; and thin film transistors connected to the scan lines, the data lines, and the organic light emitting devices. Each organic light emitting device includes a first electrode, an organic thin film layer, and a second electrode. Each thin film transistor comprises: a gate electrode formed on the first substrate; an compound semiconductor oxide activation layer that is insulated from the gate electrode, by a gate insulating film; an inorganic oxide passivation layer formed on the activation layer; and source and drain electrodes that contact the activation layer.

According to another aspect of the present invention, the passivation layer, can be used as an etch stop layer, during the formation of the source and drain electrodes, which prevents the channel region from being contaminated and/or damaged, even if the activation is damaged. The passivation layer enables the activation layer to be restored through a subsequent annealing process. Therefore, aspects of the present invention can prevent the deterioration of the electrical properties of the thin film transistor, due to the damaging of the activation layer, and can improve the properties of the substrate. The passivation layer is formed of an inorganic oxide having a relatively small band gap, making it possible to absorb external light efficiently.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
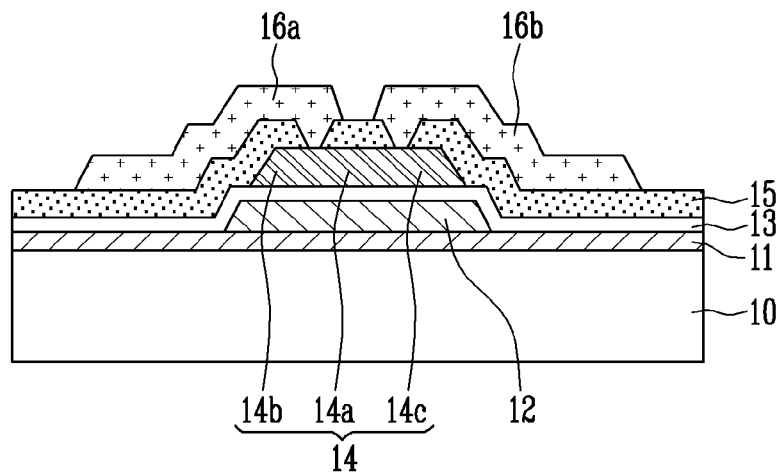
FIG. 1 is a cross-sectional view of a thin film transistor, according to aspects of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures. The described exemplary embodiments may be modified in various different ways, without departing from the spirit or scope of the present invention. Accordingly, the drawings and description are to be regarded as illustrative in nature and not restrictive. In addition, when an element is referred to as being "on" another element, it can be directly on another element or can be indirectly on the element with one, or one or more intervening elements can be interposed therebetween. Also, when an element is referred to as being "connected to" another element, it can be directly connected to the element, or can be indirectly connected to the element, with one or more intervening elements interposed therebetween.

FIG. 1 is a cross-sectional view of a thin film transistor, according to an exemplary embodiment of the present invention. In the thin film transistor, a buffer layer 11 is formed on a substrate 10, and a gate electrode 12 is formed on the buffer layer 11. An activation layer 14, which is insulated from the gate electrode 12 by a gate insulating film 13, is formed on the gate insulating film 13, over the gate electrode 12. The activation layer 14 can be formed of a compound semiconductor oxide. A channel region 14a, a source region 14b, and a drain region 14c are provided in the activation layer 14. The channel region 14a overlaps the gate electrode 12.

A passivation layer 15 is formed on the activation layer 14 and the insulating film 13. Contact holes are formed in the passivation layer 15, which expose the source and drain regions 14b and 14c. Source and drain electrodes 16a and 16b are formed on the passivation layer, and contact the source and drain regions 14b and 14c, through the contact holes.

The activation layer 14 may be formed of a compound semiconductor oxide or zinc oxide (ZnO). Herein, a compound semiconductor oxide refers to a semiconductor compound including elements from two or more different groups of the periodic table and oxygen. The activation layer 14 may be doped with at least one ion of gallium (Ga), indium (In), tin (Sn), zirconium (Zr), hafnium (Hf), and vanadium (V). The passivation layer 15 is formed of an inorganic oxide. The inorganic oxide may include elements being selected from a group consisting of gallium (Ga), indium (In), tin (Sn), zirconium (Zr), hafnium (Hf), and vanadium (V), or may include silicon (Si) or aluminum (Al).

Figure 2A:
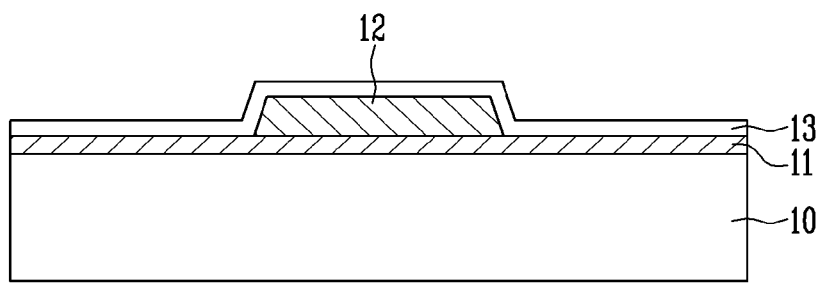
FIGS. 2A to 2D are cross-sectional views of a method of manufacturing a thin film transistor, according to an exemplary embodiment of the present invention.

FIGS. 2A to 2D are cross-sectional views of a method of manufacturing a thin film transistor, according to an exemplary embodiment of the present invention. Referring to FIG. 2A, a buffer layer 11 is formed on a substrate 10, and a gate electrode 12 is formed on the buffer layer 11. A gate insulating film 13 is formed on the gate electrode 12 and the buffer layer 11. The substrate 10 may be a semiconductor substrate such as silicon (Si); an insulating substrate, such as glass, or plastic; or a metal substrate. The gate electrode 12 may include Al, Cr, or MoW, or may include a conductive polymer. The gate insulating film 13 may be formed of an insulating material, such as $SiO_2$, $SiN_x$, or $Ga_2O_3$.

Figure 2B:
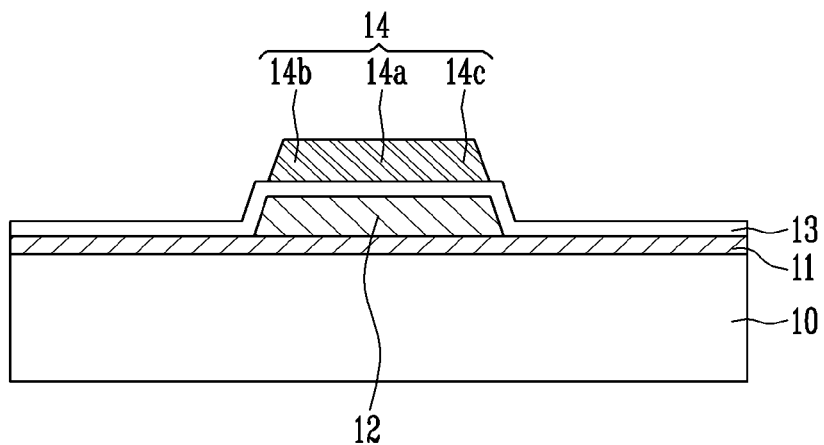

Referring to FIG. 2B, the activation layer 14 is formed on the gate insulating film 13, above the gate electrode 12. The activation layer 14 includes a channel region 14a, a source region 14b, and a drain region 14c. The activation layer 14 may be formed of the compound semiconductor oxide or zinc oxide. For example, the activation layer 14 may be formed of ZnO, ZnGaO, ZnInO, ZnSnO, or GaInZnO.

Figure 2C:
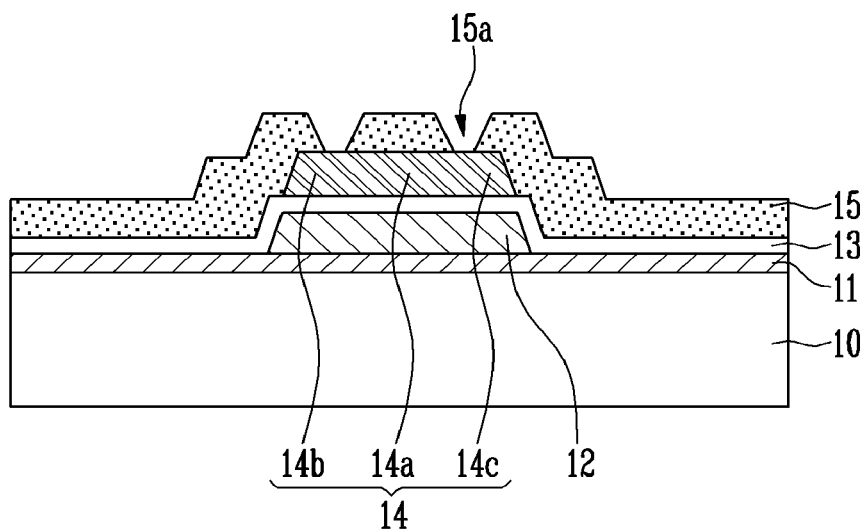

Referring to FIG. 2C, the passivation layer 15 is then patterned, thereby forming contact holes 15a that expose the source and drain regions 14b and 14c. The passivation layer 15 is formed of an inorganic oxide including, for example, elements being selected from a group consisting of gallium (Ga), indium (In), tin (Sn), zirconium (Zr), hafnium (Hf), and vanadium (V), or may include silicon (Si) or aluminum (Al). The passivation layer 15 may be formed of the same material as the compound semiconductor oxide. For example, the passivation layer may be formed of ZnO, ZnGaO, ZnInO, ZnSnO, GaO, HfO, or GaInZnO. The passivation layer 15 may alternatively include at least some elements included in the compound semiconductor oxide, such as $Ga_2O_3$. The passivation layer 15 may also include a silicon oxide ($SiO_2$), aluminum oxide ($Al_2O_3$), or aluminum oxynitride (ALON).

When a silicon oxide is used, a deposition temperature is set to below 300° C., and an oxygen partial pressure is set to at least 50%. When the aluminum oxide is used, the deposition temperature is set to below 300° C., and the content of aluminum (Al) is set to from 2 to 50%. When the aluminum oxynitride is used, the oxygen partial pressure is set to about 4%, during a sputtering deposition process, using a target of aluminum oxide ($Al_2O_3$), in an atmosphere of nitrogen and argon.

Figure 2D:
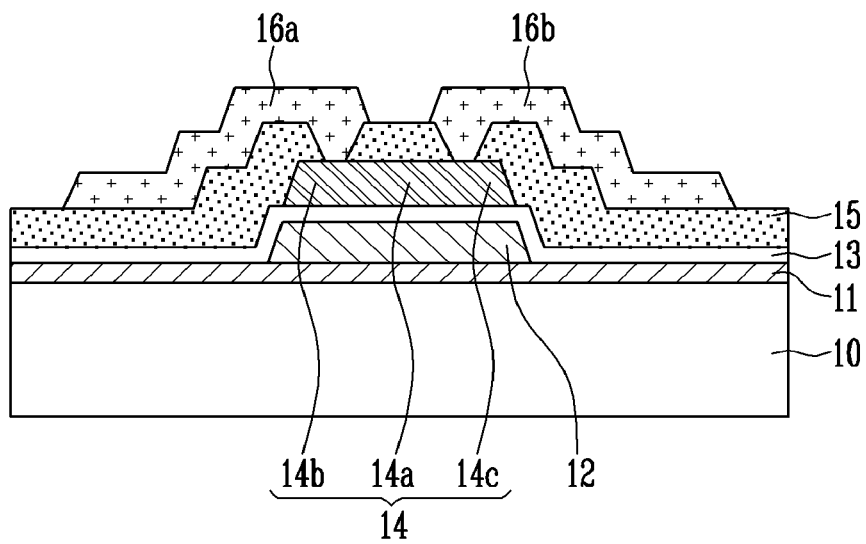

Referring to FIG. 2D, after a conductive layer is formed on the passivation layer 15 and in the contact holes 15a, the conductive layer is patterned, thereby forming source and drain electrodes 16a and 16b, which contact with the source and drain regions 14b and 14c, through the contact holes 15a. The source and drain electrodes 16a and 16b may be formed of a metal, such as Mo, MoW, Al, AlNd, or AlLiLa.

The passivation layer 15 may be used as an etch stop layer, during the patterning of the conductive layer, which facilitates the etching process. The activation layer 14 is thereby protected in the channel region 14a, during the etching process. Contamination of the activation layer 14, due to organic material from a subsequent process, is also prevented.

However, when the passivation layer 15 is formed of material having low etching selectivity, with respect to the compound semiconductor, the activation layer 14 may be damaged during the etching of the contact holes 15a. The material and/or the etching method should thus be selected accordingly. When the activation layer 14 is damaged, the activation layer 14 may be restored, however, if the activation layer 14 is annealed at a temperature of from 200 to 350° C., in vacuum of about 10e-2, and in an atmosphere of nitrogen (N2) and oxygen (O2), after the source and drain electrodes 16a and 16b are formed.

A deterioration of the electrical properties of the compound semiconductor, due to plasma damage, is inferred to be primarily generated by an oxygen deficiency, resulting from the breakage of surface gratings. Therefore, aspects of the present invention protect the activation layer 14, by using the inorganic oxide passivation layer 15. This also permits the restoration of the activation layer 14, through the subsequent annealing. The restoration of the activation layer 14 is inferred to result from oxygen diffusing from the passivation layer 15.

Figure 3A:
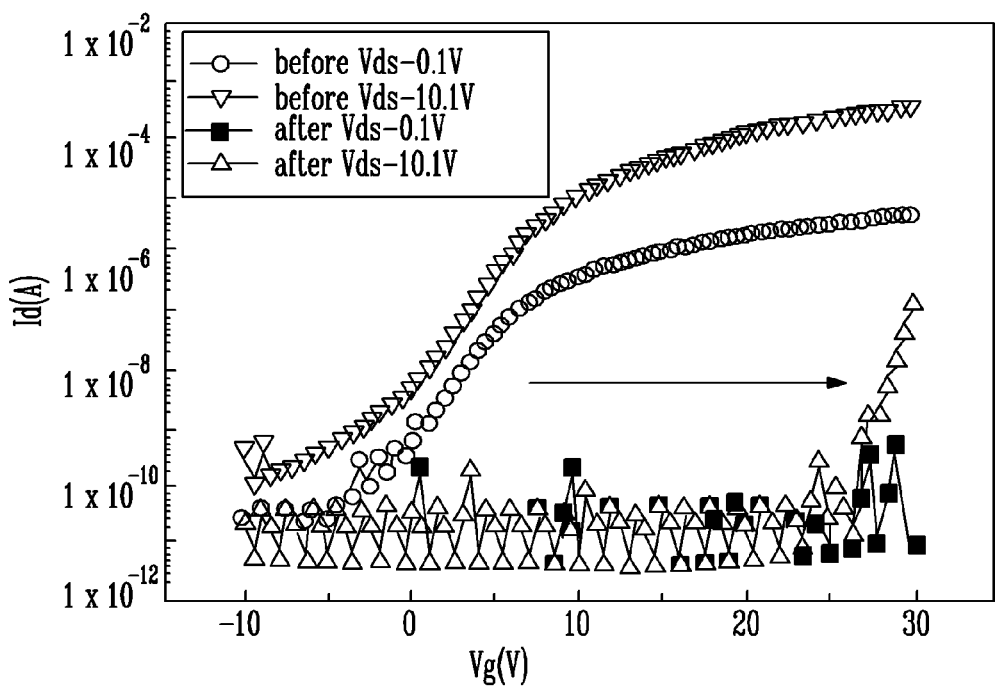
FIGS. 3A and 4A are graphs showing drain currents according to gate voltages.
Figure 3B:
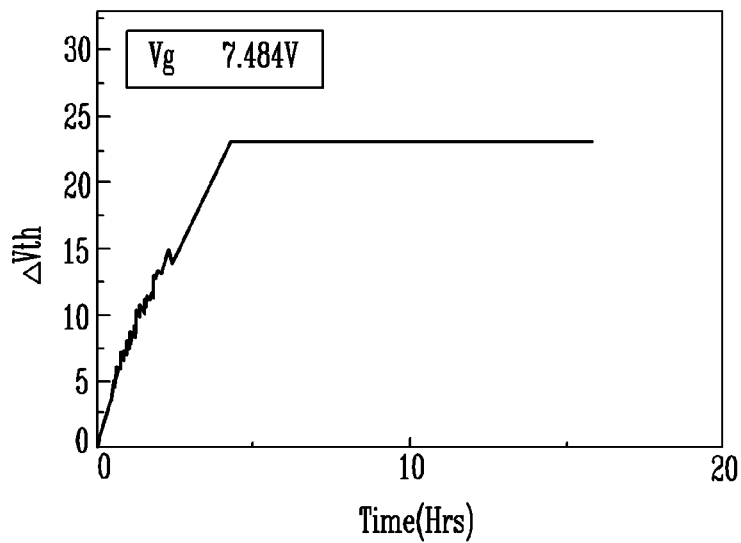
FIGS. 3B and 4B are graphs showing changes in threshold voltages, over time.
Figure 4A:
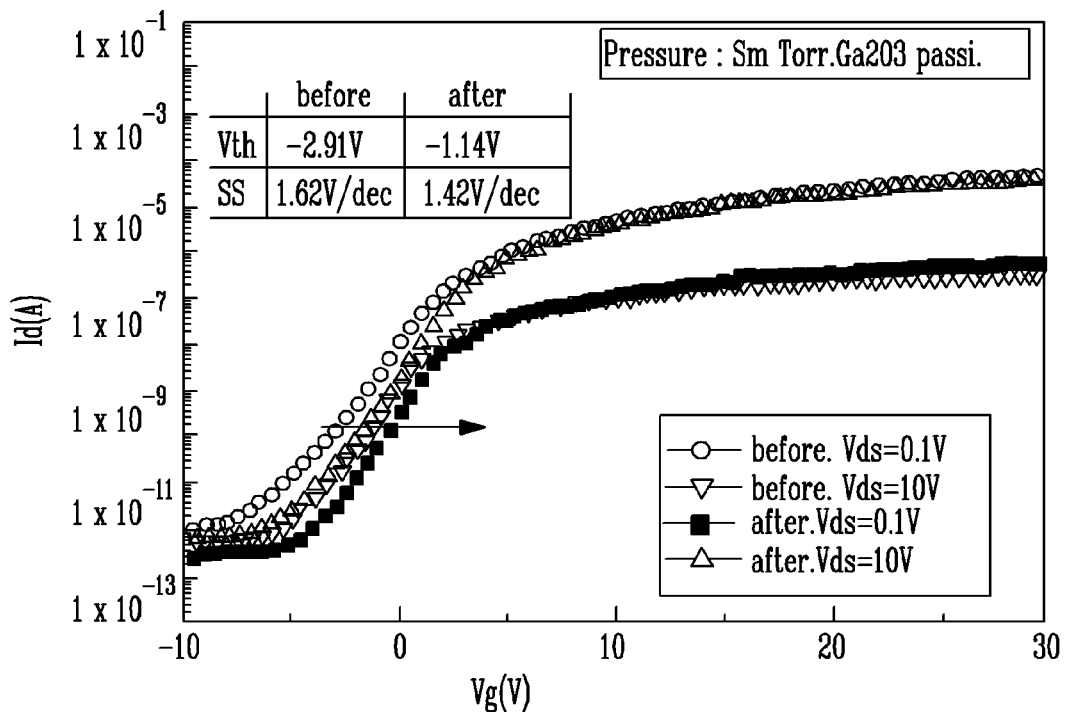
Figure 4B:
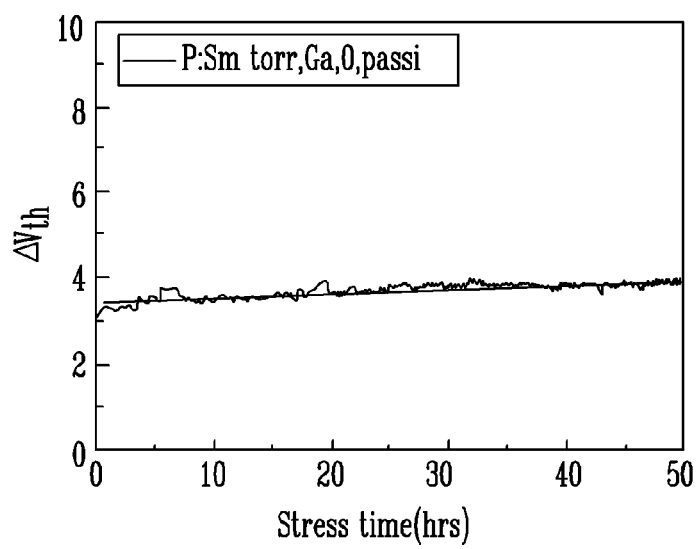

FIG. 3A is a graph showing drain currents Id(A), according to gate voltages Vg of a thin transistor, that does not include a passivation layer is not formed. FIG. 3B is a graph showing threshold voltages Vth over time, of the transistor. FIG. 4A is a graph showing a change of a drain currents Id(A), according to gate voltages Vg, of a thin transistor including a passivation layer 15 formed according to aspects of the present invention. FIG. 4B is a graph illustrating threshold voltages Vth according to stress time, of the transistor including the passivation layer 15. The measurement is performed for 50 hours, during which a voltage Vds of 10 V is applied to source and drain electrodes 16a and 16b. The gate voltage Vg is set to a current of 3 μA.

In the cases of FIGS. 3A and 3B, the threshold voltage Vth abruptly increases in a positive (+) direction, as time elapses, and the threshold voltage increases such that it cannot be accurately measured after about 5 hours. On the contrary, in the cases of FIGS. 4A and 4B, the fluctuation width of the threshold voltage Vth is less than about 1V and remains stable for over 50 hours.

In a conventional thin film transistor having a polysilicon activation layer, a passivation layer is generally formed of a silicon oxide (SiO2), silicon nitride (SiNx), or aluminum oxide (Al2O3). However, in the case of a thin film transistor having an activation layer formed of a compound semiconductor oxide, if a passivation layer is formed of a conventionally formed silicon oxide (SiO2), silicon nitride (SiNx), or aluminum oxide (Al2O3), the electrical properties thereof, can be seriously degraded. This degradation is inferred to be generated by plasma during a deposition process. If the damage occurs, the carrier concentration of the activation layer may increase, due to an oxygen deficiency. In addition, an off current may increase, due to the increased carrier concentration, resulting in a reduction in the S-factor thereof.

Figure 5A:
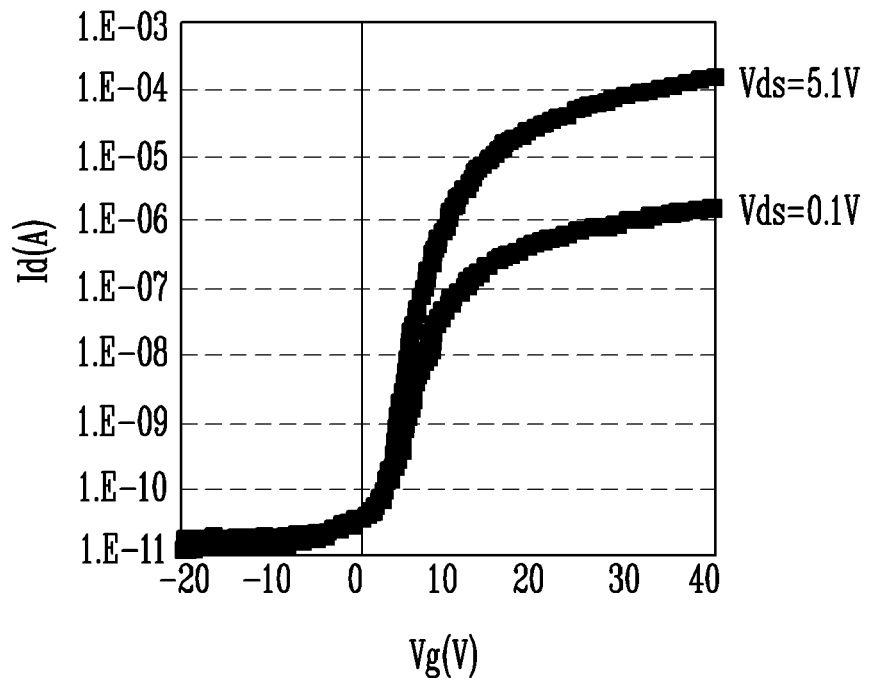
FIG. 5A is a graph showing the electrical properties of a thin film transistor without a passivation layer.
Figure 5B:
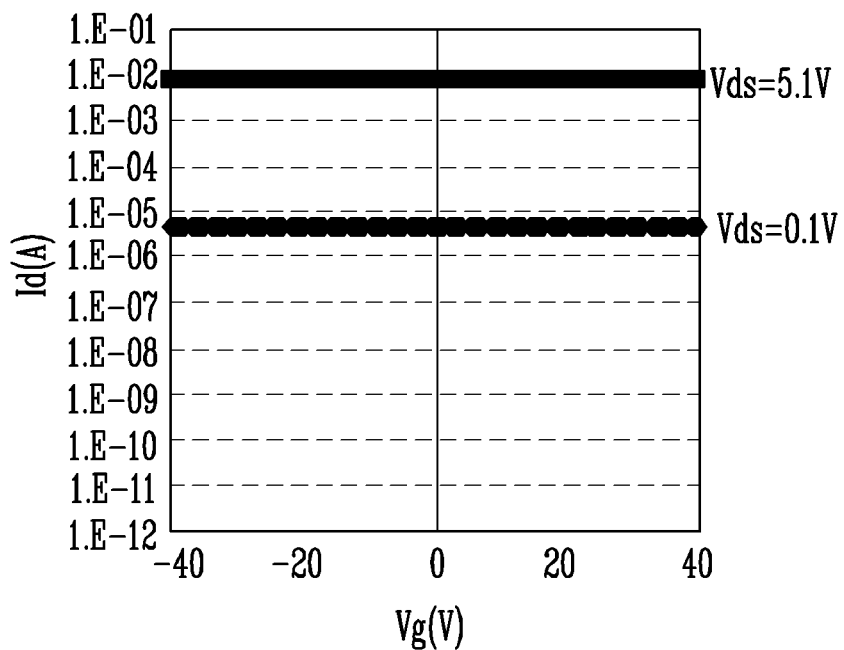
FIGS. 5B and 5C are graphs showing the electrical properties of a thin film transistor with a passivation layer.
Figure 5C:
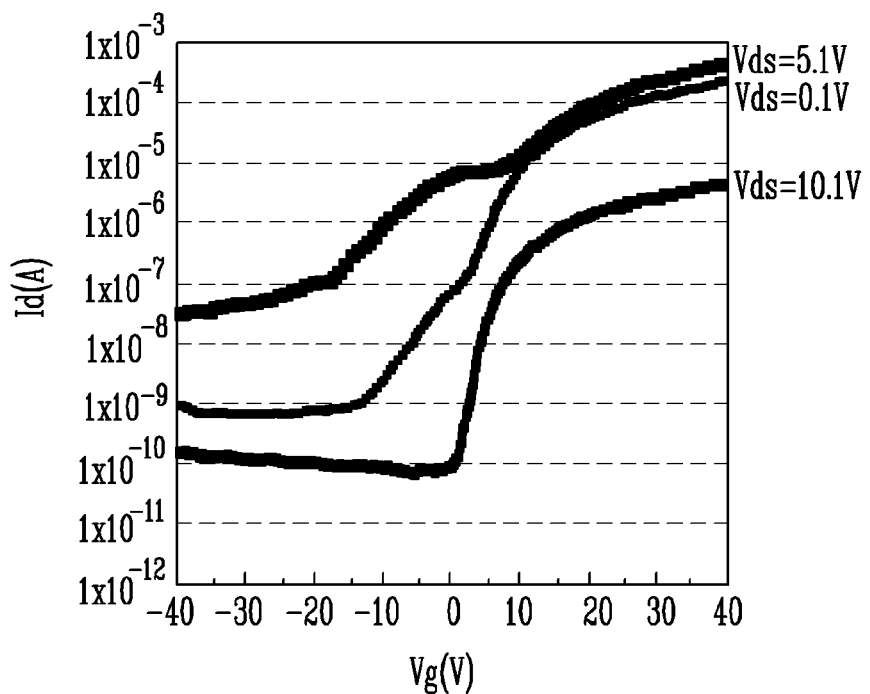

FIG. 5A is a graph showing electrical properties of a thin film transistor, in which a passivation layer is not yet formed. FIGS. 5B and 5C are graphs showing the electrical properties of a thin film transistor, in which a silicon oxide (SiO2) passivation layer and an aluminum oxide (Al2O3) passivation layer are formed, respectively. The passivation layers were formed using a conventional process. As shown in FIGS. 5B and 5C, after forming the silicon oxide (SiO2) passivation layer and the aluminum oxide (Al2O3) passivation layer, the electrical properties of the thin film transistors were reduced, as indicated by the I-V (current-voltage) curves.

Figure 6A:
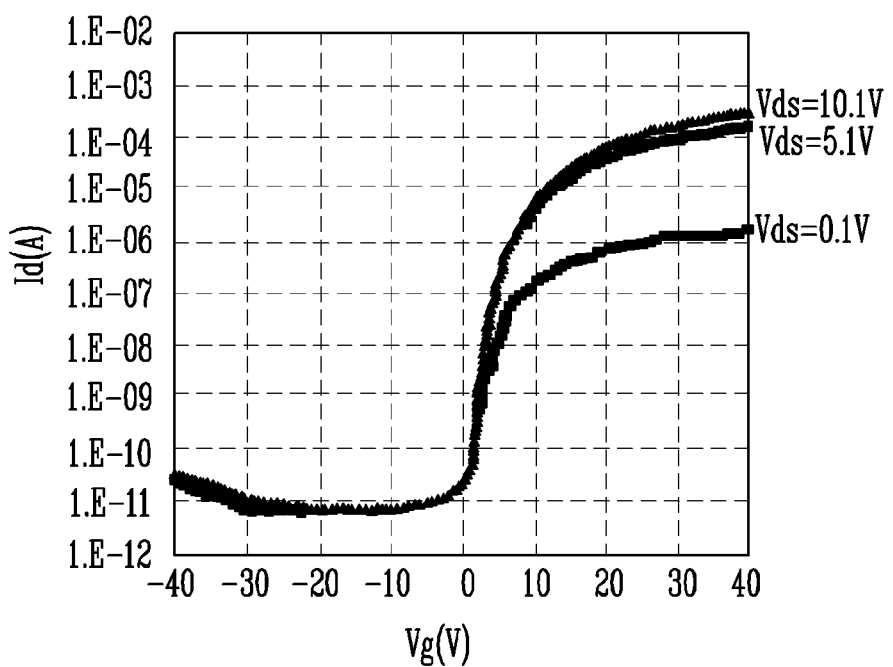
FIGS. 6A and 6B are graphs showing the electrical properties of thin film transistors, according to aspects of the present invention.
Figure 6B:
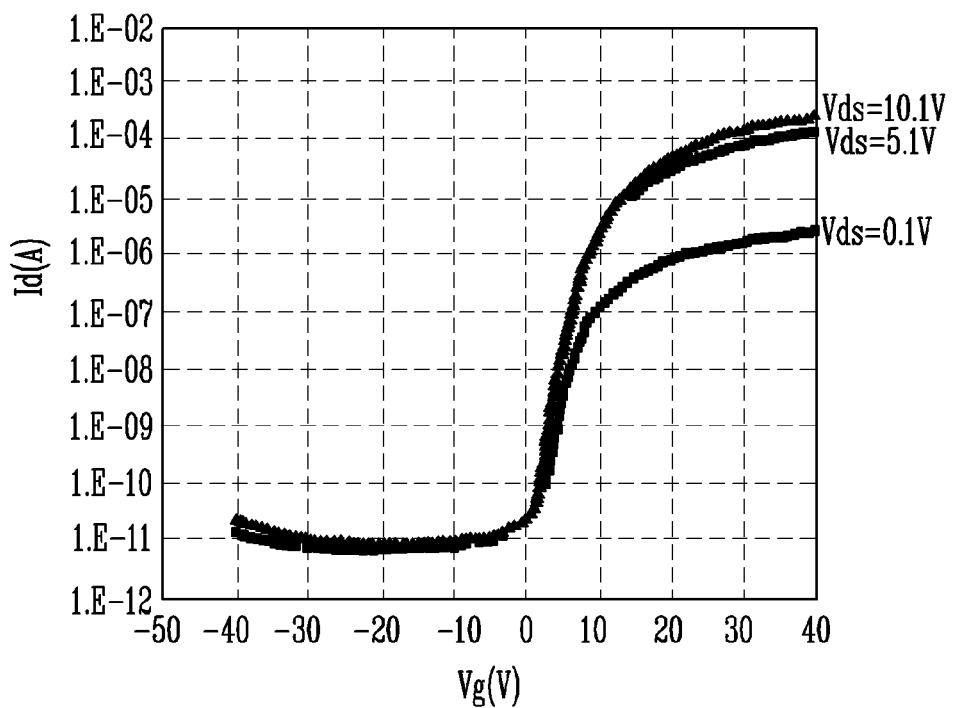

FIG. 6A shows results from a thin film transistor including a GaInZnO passivation layer and a GaInZnO activation layer. FIG. 6B shows results from a thin film transistor including a Ga2O3 passivation layer and a GaInZnO activation layer. The threshold voltage increased by about 2.4V (FIG. 6A), and decreased by about 0.2V (FIG. 6B), as compared to the threshold voltage of 3.3V shown in FIG. 5A, when thin film transistor did not include the passivation layer.

Figure 7A:
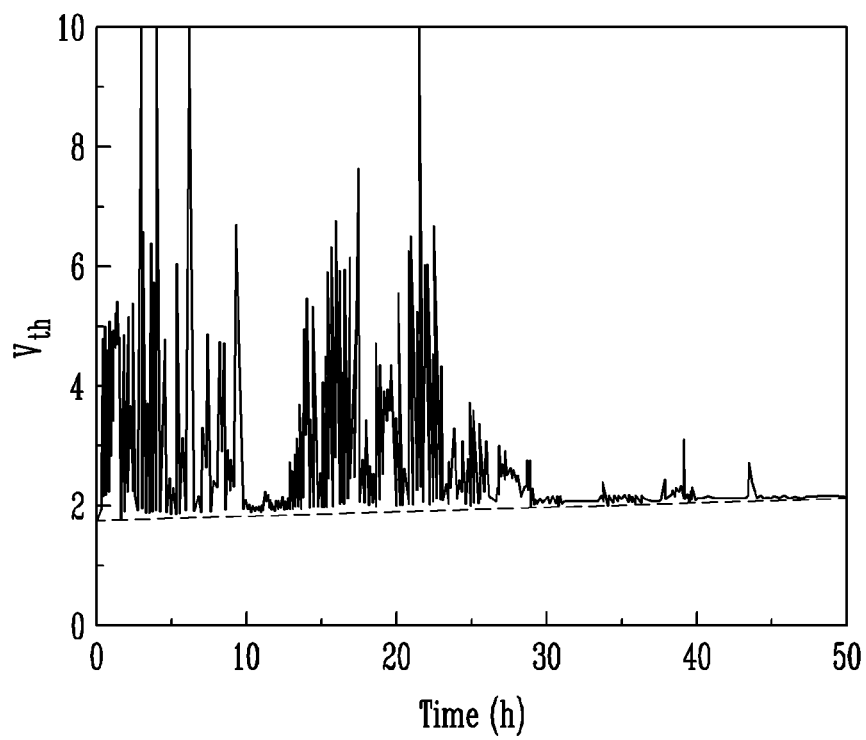
FIGS. 7A and 7B are graphs showing the reliability of a thin film transistor, according to aspects of the present invention.
Figure 7B:
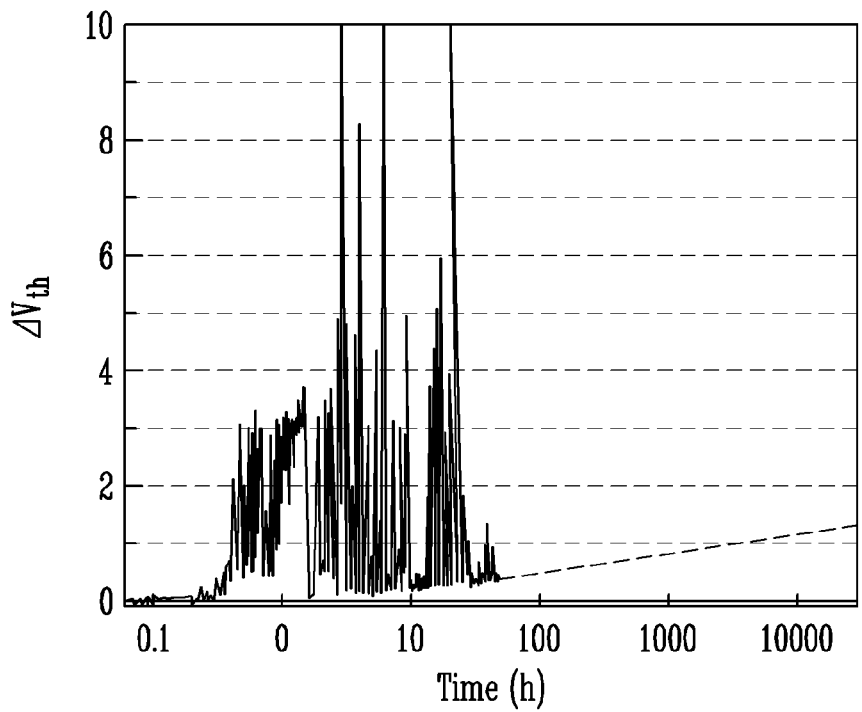

FIGS. 7A and 7B are graphs showing the reliability of a thin film transistor including an activation layer 14 formed by depositing GaInZnO at a pressure of 3 mTorr, and a Ga2O3 passivation layer, according to aspects of the present invention. In FIGS. 7A and 7B, the dashed lines represent a threshold voltage Vth, and the solid lines represent noise or abrupt voltage changes. The source and drain voltage was 10V, and the gate voltage was set to insure a constant current of 3 μA.

There was slight changes in both cases when the measurements were taken after 50 hours (FIG. 7A) and after 10000 hours (FIG. 7B). From the dashed line of FIG. 7, which shows the change of the threshold voltage Vth, it is inferred that there may be a change of 1.2V or less, after 30000 hours.

The stable electrical properties are due to the passivation layer formed of an inorganic oxide. In other words, since the passivation layer includes an inorganic oxide, the passivation layer 15 more easily captures (suppress) surplus carriers generated during a deposition process, thereby preventing the deterioration of electrical properties, due to the surplus carriers.

Also, the passivation layer of the present invention prevents the deterioration of transistor properties, due to external light. Although GaInZnO, which is a compound semiconductor, has a large band gap, surplus carriers are generated if light is absorbed thereon, so that a leakage current may occur, and transistor properties may be degraded. In particular, a bottom gate structure is more susceptible to external light, as compared to a top gate structure.

Figure 8A:
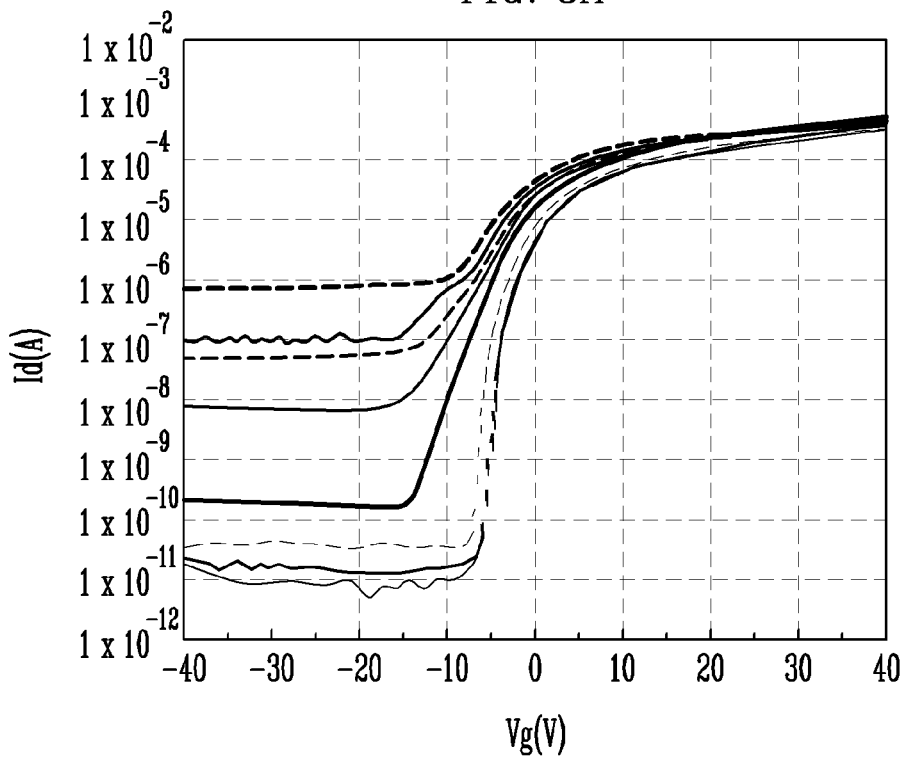
FIGS. 8A and 8B are graphs showing the transfer properties of a transistor, according to the absorption of external light.

As shown in FIG. 5B, if the passivation layer 15 is formed of silicon oxide (SiO2), which has a large band gap, the external light is not blocked efficiently. Therefore, the transfer properties of the transistor deteriorated, as shown in FIG. 8A. In FIG. 8A, light of 0 to 20000 Lux was applied to the thin film transistor, when a 5.1V voltage Vds was applied to the source and drain electrodes 16a and 16b.

Figure 8B:
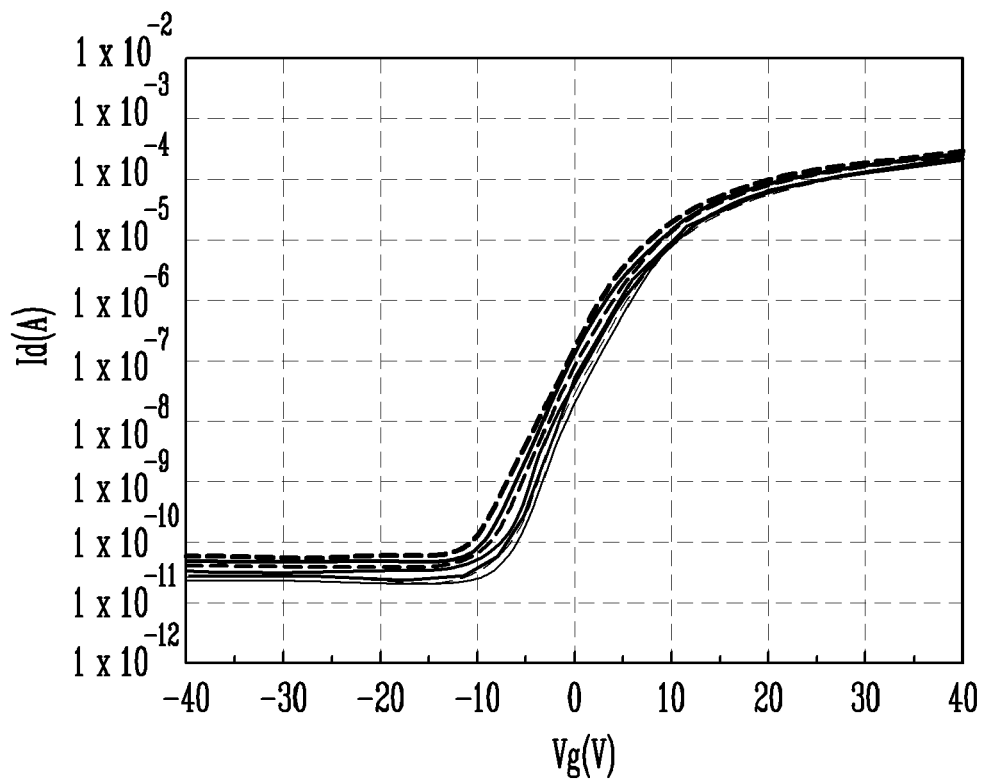

However, in the thin film transistor of the present invention, as shown in FIG. 6B, the passivation layer is formed of an inorganic oxide, such as Ga2O3, which has a relatively small band gap, so that the external light is absorbed with ease. Therefore, the activation layer was protected from the external light by the passivation layer, and detachment of oxygen due to the optical absorption of light are prevented, the transfer properties of the transistor were preserved, as shown in FIG. 8B.

The deterioration of the activation layer, due to the absorption of light may cause a deterioration of image quality and an increase of power consumption of a display device including the thin film transistor. Therefore, a conventional amorphous silicon thin film transistor generally has a dual gate structure, a lightly doped drain (LDD) structure, or an offset structure, which can reduce a leakage current. However, in this case, there are problems that the drain current in a turned-on state is reduced, and additional processes are added. However, with the present invention, since the passivation layer is formed of inorganic oxide having a small band gap, external light is efficiently absorbed, so there is no need to add a separate process or device for compensating for the deterioration of the electrical properties.

Figure 9:
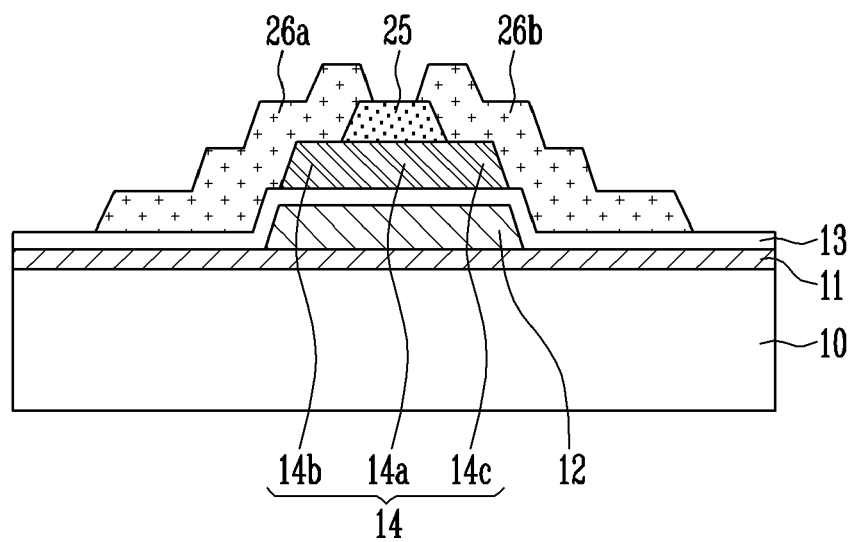
FIG. 9 is a cross-sectional view of a thin film transistor, according to an exemplary embodiment of the present invention.

FIG. 9 is a cross-sectional view of a thin film transistor, according to another exemplary embodiment of the present invention. While the passivation layer 15 of the thin film transistor of FIG. 1 is formed across the activation layer 14 and the insulating film 13, the thin film transistor of FIG. 9 comprises a passivation layer 25 formed only on the activation layer. In addition, source and drain electrodes 26a and 26b contact source and drain regions 14b and 14c of the activation layer 14, without passing through contact holes in the passivation layer 15, as shown in FIG. 1.

The activation layer 14 can be protected by the passivation layer 25, and the contact resistance can also be reduced, by the direct contact of the source and drain electrodes 26a and 26b to the source and drain regions 14b and 14c. The passivation layer 25 can be formed of the same materials as the passivation layer 15.

The thin film transistor of FIG. 9 can be manufactured using the same method as the thin film transistor of FIG. 1, except that instead for forming the contact holes 15a by patterning the passivation layer 15, a portion of the passivation layer 25 is removed during patterning, such that the passivation layer 25 is only present on a portion of the activation layer 14.

Figure 10:
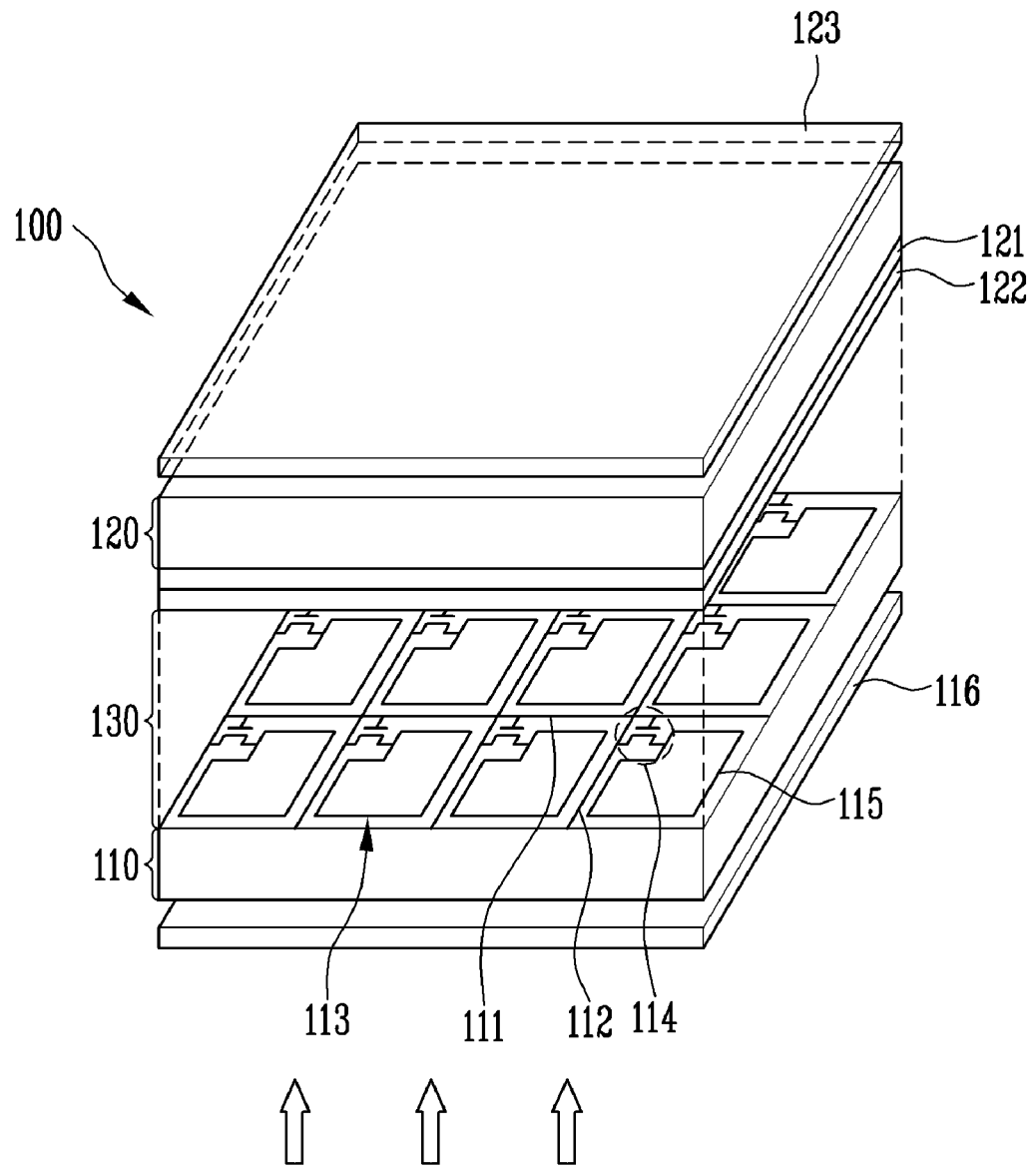
FIG. 10 is a plan view of a flat panel display device having a thin film transistor, according to an exemplary embodiment the present invention.

The thin film transistors, according to aspects of the present invention, may be applied to a flat panel display device. FIG. 10 is a plan view of a flat panel display device including a thin film transistor, according to aspects of the present invention. The flat panel display device includes a display panel 100 that displays an image. The display panel 100 includes opposing first and second substrates 110 and 120, and a liquid crystal layer 130 disposed therebetween. A matrix of scan lines 111 and data lines 112 are disposed on the first substrate 110, and pixels 113 are formed in the matrix.

Each pixel 113 includes a pixel electrode 115 and a thin film transistor 114. The thin film transistor 114 is connected to the scan lines 111 and the data lines 112. The thin film transistor 114 controls the supply of signals to each pixel electrode 115, from the scan lines 111 and data lines 111. The thin film transistor 114, can be exemplified by the thin film transistors of FIG. 1 or 9, and may be manufactured according to the manufacturing method of FIGS. 2A to 2D.

A color filter 121 and a common electrode 122 are formed on an inner surface of the second substrate 120. Polarizing plates 116 and 123 are formed on outer surfaces of the first and second substrates 110 and 120, respectively. A backlight (not shown) can be disposed under the polarizing plate 116. A driver LCD Drive IC (not shown), which drives the display panel 100, is mounted in the periphery of the display panel 100. The driver converts externally supplied electrical signals into scan signals and data signals, which are supplied to the gate lines 111 and the data lines 112, respectively.

Figure 11A:
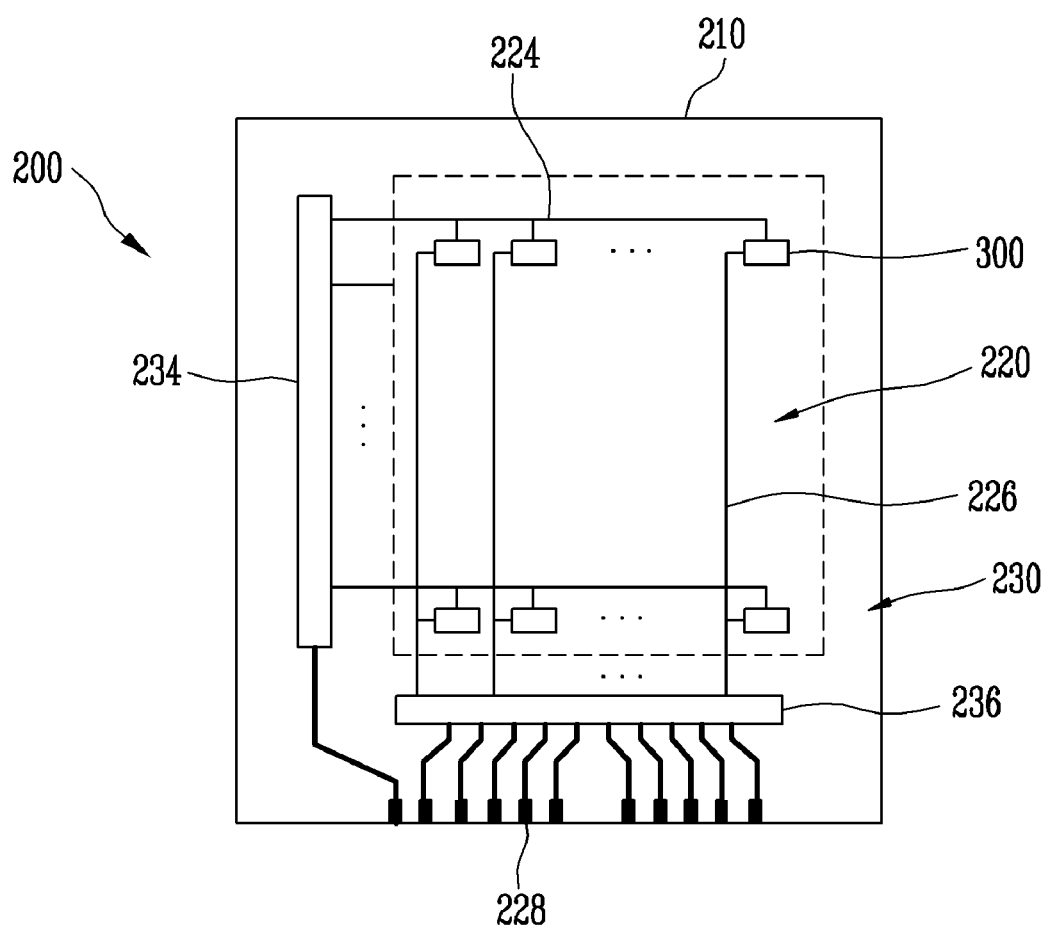
FIGS. 11A and 11B are respectively a plan view and a cross-sectional view of a flat panel display device having a thin film transistor, according to an exemplary embodiment of the present invention.
Figure 11B:
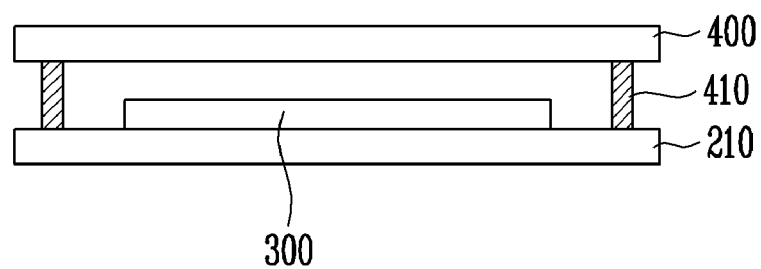

FIGS. 11A and 11B are a plan view and a cross-sectional view of another exemplary embodiment of a flat panel display device. The flat panel display device includes a display panel 200 that displays an image. The display panel 200 includes a substrate 210 having a pixel region 220, and a non-pixel region 230 disposed around the pixel region 220. A plurality of organic light emitting devices 300 are disposed within, and connected to, a matrix of scan lines 224 and data lines 226, which are formed on the substrate 210. The scan lines 224 and data lines 226 extend into the pixel region 200. Power supply lines (not shown), which operate the organic light emitting device 300, and a scan driver 234 and a data driver 236, which supply signals to the scan lines 224 and the data lines 226, are formed in the non-pixel region 230.

Figure 12:
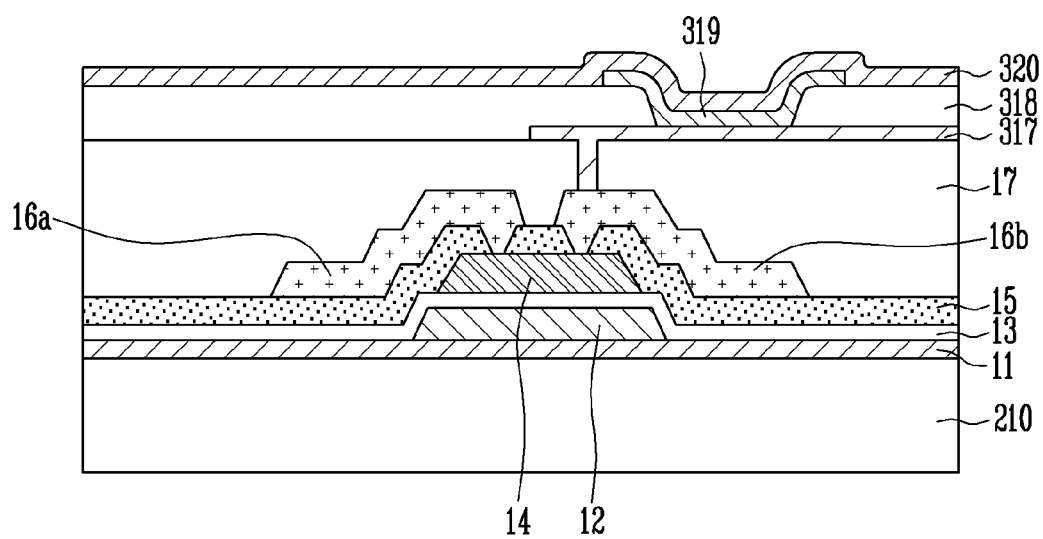
FIG. 12 is a cross-sectional view of an organic light emitting device of FIGS. 11A and 11B.

Referring to FIG. 12, each organic light emitting device 300 includes an anode electrode 317, a cathode electrode 320, and an organic thin film layer 319 formed between the anode electrode 317 and the cathode electrode 320. The organic thin film layer 319 includes a hole transport layer, an organic light emitting layer, and an electron transport layer, which are stacked. The organic thin film layer 319 may also include a hole injection layer and an electron injection layer. The organic light emitting device 300 may further include thin film transistors which control the operation of the organic light emitting device 300, and a capacitor which maintains signals. The thin film transistor, which can have the structures of FIG. 1 or 9, may be manufactured according to the exemplary manufacturing method of the present invention, as shown in FIGS. 2A to 2D.

Referring to FIGS. 11A and 12, in each organic light emitting device 300 a buffer layer 11 is formed on a substrate 210, and a gate electrode 12 is formed on the buffer layer 11, in a pixel region 220. The scan lines 224 are coupled to gate electrodes 12 of the organic light emitting devices 300 and to the scan driver 234. The data lines 226 connect the organic light emitting devices 300 to the data driver 236. Pads 228 to receive external signals may be formed in the non-pixel region 230. An activation layer 14 that includes a channel region, a source region, and a drain region, is formed on the gate electrode 12. The activation layer 14 is electrically insulated form the gate electrode 12, by a gate insulating film 13.

A passivation layer 15 is formed on the activation layer 14, and contact holes are formed in the passivation layer 15, which expose the source and drain regions of the activation layer 14. The source and drain electrodes 16a and 16b are formed on the passivation layer 15 and are coupled to the source and drain regions 14b and 14c, through the contact holes.

An organic planarization layer 17 is formed on the source and drain electrodes 16a and 16b. A hole is formed on the planarization layer 17, which exposes the drain electrode 16b. An anode electrode 317 coupled to the drain electrode 16b, via the hole. A pixel definition film 18 is formed on the planarization layer 17 and has a hole that exposes the anode electrode 317. An organic thin film layer 319 is formed on the exposed anode electrode 317, and a cathode electrode 320 is formed on the pixel defining film 318, in contact with the organic thin film layer 319.

Referring to FIG. 11B, a sealing substrate 400, which seals the pixel regions 220, is disposed on the upper substrate 210. The sealing substrate 400 is bonded to the upper substrate 210 by a sealant 410, thereby completing a display panel 200.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. A method of manufacturing a thin film transistor, comprising:

forming a gate electrode on a substrate;
forming a gate insulating film on the gate electrode;
forming an activation layer comprising a compound semiconductor oxide or zinc oxide (ZnO), on the gate insulating film;
forming a passivation layer comprising an inorganic oxide, on the activation layer, the inorganic oxide comprising at least one metal comprised in the activation layer; and
forming source and drain electrodes in contact with the activation layer, wherein the inorganic oxide comprises gallium (Ga), indium (In), tin (Sn), zirconium (Zr), hafnium (Hf), vanadium (V), or a combination thereof, and
wherein the forming of the passivation layer comprises forming contact holes in the passivation layer.

2. The method of manufacturing the thin film transistor as claimed in claim 1, wherein the forming of the source and drain electrodes comprises:
forming a conductive layer on the passivation layer and in the contact holes; and
patterning the conductive layer to form the source and drain electrodes, which contact the activation layer through the contact holes.

3. The method of manufacturing the thin film transistor as claimed in claim 1, wherein the activation layer comprises zinc oxide (ZnO).

4. The method of manufacturing the thin film transistor as claimed in claim 3, wherein the activation layer is doped with at least one ion of gallium (Ga), indium (In), tin (Sn), zirconium (Zr), hafnium (Hf), and vanadium (V).

5. The method of manufacturing the thin film transistor as claimed in claim 1, wherein the inorganic oxide comprises elements that are also comprised in the compound semiconductor oxide.

6. The method of manufacturing the thin film transistor as claimed in claim 5, wherein the compound semiconductor oxide comprises gallium (Ga), indium (In), tin (Sn), zirconium (Zr), hafnium (Hf), vanadium (V), or a combination thereof.

7. The method of manufacturing the thin film transistor as claimed in claim 1, further comprising forming a buffer layer on the substrate.

8. A method of manufacturing a thin film transistor, comprising:
forming a gate electrode;
forming a gate insulating film on the gate electrode;
forming an activation layer comprising a compound semiconductor oxide or zinc oxide (ZnO), on the gate insulating film;
forming a passivation layer comprising an inorganic oxide, on the activation layer, the inorganic oxide comprising at least one metal comprised in the activation layer;
forming source and drain electrodes in contact with the activation layer, and
annealing the passivation layer,
wherein the inorganic oxide comprises gallium (Ga), indium (In), tin (Sn), zirconium (Zr), hafnium (Hf), vanadium (V), or a combination thereof.

9. A method of manufacturing a thin film transistor, comprising:
forming a gate electrode;
forming a gate insulating film on the gate electrode;
forming an activation layer comprising a compound semiconductor oxide or zinc oxide (ZnO), on the gate insulating film;
forming a passivation layer comprising an inorganic oxide, on the activation layer, the inorganic oxide comprising at least one metal comprised in the activation layer; and
forming source and drain electrodes in contact with the activation layer,
wherein the inorganic oxide comprises gallium (Ga), indium (In), tin (Sn), zirconium (Zr), hafnium (Hf), vanadium (V), or a combination thereof, and
wherein the forming of the source and drain electrodes comprises using the passivation layer as an etch stop layer.

10. A method of manufacturing a thin film transistor, comprising:
forming a gate electrode on a substrate;
forming a gate insulating film on the gate electrode;
forming an activation layer comprising a compound semiconductor oxide or zinc oxide (ZnO), on the gate insulating film;
forming a passivation layer comprising an inorganic oxide, on the activation layer, the inorganic oxide comprising at least one metal comprised in the activation layer; and
forming source and drain electrodes on the passivation layer in contact with the activation layer,
wherein the inorganic oxide comprises gallium (Ga), indium (In), tin (Sn), zirconium (Zr), hafnium (Hf), vanadium (V), or a combination thereof.

* * * * *